United States Patent [19]
Den

[11] Patent Number: 5,523,616
[45] Date of Patent: Jun. 4, 1996

[54] SEMICONDUCTOR DEVICE HAVING LAMINATED TIGHT AND COARSE INSULATING LAYERS

[75] Inventor: Yasuhide Den, Tokyo, Japan

[73] Assignee: NEC Corporation, Japan

[21] Appl. No.: 328,456

[22] Filed: Oct. 25, 1994

[30] Foreign Application Priority Data

Oct. 29, 1993 [JP] Japan ........................... 5-271092

[51] Int. Cl.⁶ .......................... H01L 21/56; H01L 23/29; H01L 23/31
[52] U.S. Cl. .................. 257/637; 257/640; 257/758; 257/760
[58] Field of Search ................... 257/639–641, 257/758–760, 649, 637

[56] References Cited

U.S. PATENT DOCUMENTS 4,543,707  10/1985  Ito et al. .................. 257/639
5,306,946   4/1994  Yamamoto ................ 257/760

FOREIGN PATENT DOCUMENTS

| 0128128 | 6/1987 | Japan . |
| 0174927 | 7/1987 | Japan . |
| 0242331 | 10/1987 | Japan . |
| 0109623 | 4/1992 | Japan ........................ 257/640 |
| 0335345 | 12/1993 | Japan ........................ 257/640 |

OTHER PUBLICATIONS

Translation of Japan Kokai Publication #04–109623 to Saito 19 pages.

*Primary Examiner*—Peter Toby Brown
*Attorney, Agent, or Firm*—Laff, Whitesel, Conte & Saret, Ltd.

[57] ABSTRACT

In a semiconductor device having a passivation layer, the passivation layer includes a laminated configuration formed by a plurality of tight insulating layers and a plurality of coarse insulating layers alternating with the tight insulating layers.

6 Claims, 4 Drawing Sheets

LOW FREQUENCY POWER (W) /
HIGH FREQUENCY POWER (W)

5,523,616

SEMICONDUCTOR DEVICE HAVING LAMINATED TIGHT AND COARSE INSULATING LAYERS

BACKGROUND OF THE INVENTION

1. Field of the Invention

The present invention relates to a semiconductor device having a passivation layer.

2. Description of the Related Art

In a semiconductor device, a multi-layer configuration bas been used as a passivation layer.

A first prior art passivation layer includes a double layer configuration formed by a phospho silicate glass (PSG) layer and a silicon nitride layer formed thereon. This will be explained later in detail.

In the first prior art passivation layer, however, since water penerates through very small defects in the silicon nitride layer and is absorbed in the PSG layer, metal connections directly in contact with the PSG layer may be eroded by the water absorbed in the PSG layer. Also, two different kinds of insulating layers used in the passivation layer require different manufacturing apparatuses, thus increasing the manufacturing cost thereof.

A second prior art passivation layer includes a triple layer configuration formed by a lower silicon nitride layer, a PSG layer formed thereon, and an upper silicon nitride layer (see JP-A-SHO62-128128 and JP-A-SHO62-242331). As a result, the lower silicon nitride layer prevents water absorbed in the PSG layer from penetrating into metal connections beneath the lower silicon nitride layer. Also, the mechanical strength of the passivation layer is enhanced as compared with the first prior art passivation layer. This will be also explained in detail.

In the second prior art passivation layer, however, since the PSG layer has deteriorated step coverage characteristics, it is impossible to thicken the lower silicon nitride layer, so that the prevention of penetration of water into the metal connections is insufficient. Also, two different kinds of insulating layers used in the passivation layer require two different manufacturing apparatuses, thus increasing the manufacturing cost.

A third prior art passivation layer includes a double layer configuration formed by a fluorine-including silicon nitride layer and a silicon nitride layer formed thereon (see JP-A-SHO62-174927). As a result, deterioration of semiconductor elements formed beneath the passivation layer due to the diffusion of hydrogen can be avoided, and simultaneously, erosion of metal connections beneath the passivation layer can be avoided by using the water resistance characteristics of silicon nitride.

In the third prior art passivation layer, however, since the fluorine-including silicon nitride layer reacts with water ($H_2O$) to generate hydrogen fluoride (HF), metal connections beneath the passivation layer are eroded by the hydrogen fluoride.

SUMMARY OF THE INVENTION

It is an object of the present invention to provide a reliable passivation layer.

Another object is to provide a passivation layer having a reduced manufacturing cost.

According to the present invention, in a semiconductor device having a passivation layer, the passivation layer includes a laminated configuration formed by a plurality of tight insulating layers and a plurality of coarse insulating layers alternating with the tight insulating layers.

Also, according to the present invention, the tight insulating layers and the coarse insulating layers are made of the same material such as silicon nitride or silicon oxynitride.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, prior art semiconductor devices will be explained with reference to FIGS. 1, 2 and 3.

Figure 1:
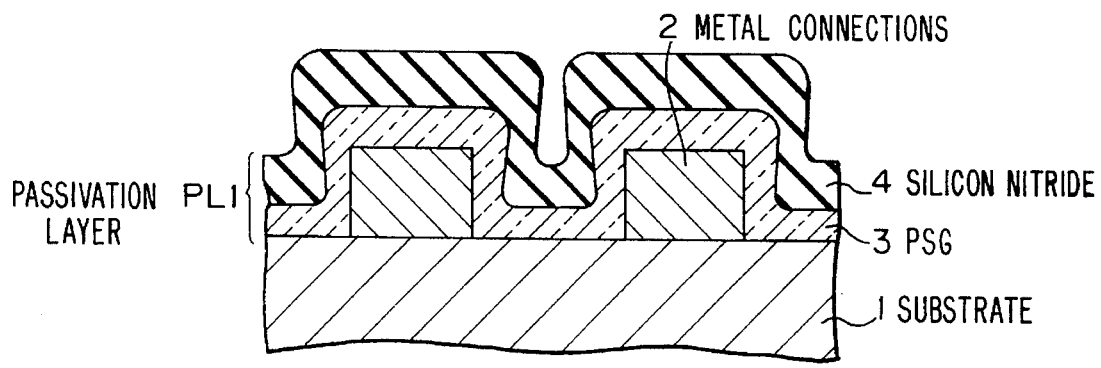
FIG. 1 is a cross-sectional view illustrating a first prior semiconductor device.

In FIG. 1, which illustrates a first prior art semiconductor device, reference numeral 1 designates a semiconductor substrate on which metal connections 2 are formed. Formed on the metal connections 2 is a 500 nm thick PSG layer 3 and a 700 nm thick silicon nitride layer 4 as a double layer passivation layer PL1. In this case, the PSG layer 3 is deposited by an atmospheric CVD (APCVD) process using a reaction gas of silane ($SiH_4$), phosphine ($PH_3$) and oxygen ($O_2$). Also, the silicon nitride layer 4 is deposited by a plasma CVD process using reaction gas of silane ($SiH_4$) and ammonia ($NH_3$).

In the semiconductor device of FIG. 1, however, as stated above, since water penerates through very small defects of the silicon nitride layer 4 and is absorbed in the PSG layer 3, the metal connections 2 directly in contact with the PSG layer 3 may be eroded by the water absorbed in the PSG layer 3. Also, two different kinds of the insulating layers 3 and 4 used in the passivation layer PL require two different apparatuses, i.e., an APCVD apparatus and a plasma CVD apparatus, thus increasing the manufacturing cost thereof.

Figure 2:
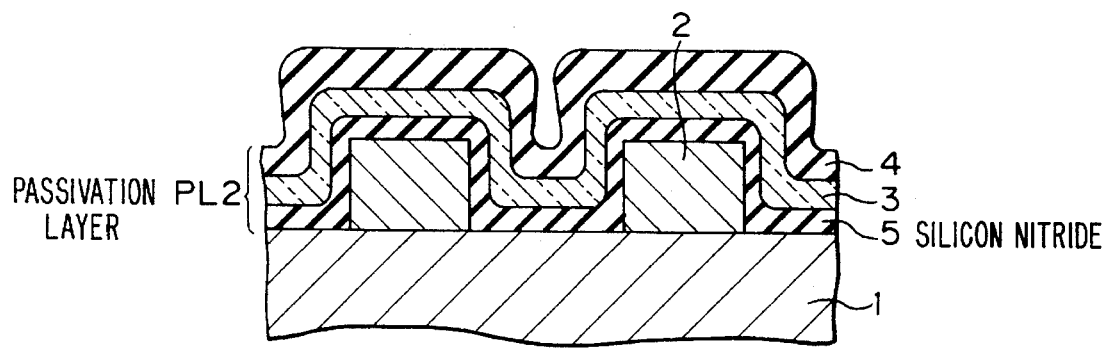
FIG. 2 is a cross-sectional view illustrating a second prior semiconductior device.

In FIG. 2, which illustrates a second prior art semiconductor device, a silicon nitride layer 5 is added to the elements of FIG. 2, thus forming a passivation layer PL2 as a triple layer configuration. In this case, the thickness of the silicon nitride layer 5 is 100 nm, the thickness of the PSG layer 3 is 600 nm, and the thickness of the silicon nitride layer 4 is 300 nm. Also, the silicon nitride layers 5 and 4 are deposited by an APCVD process, and the PSG layer 3 is deposited by a plasma CVD process. As a result, the silicon nitride layer 5 prevents water absorbed in the PSG layer 3 from penetrating into the metal connections 2 beneath the lower silicon nitride layer 5. Also, the mechanical strength of the passivation layer PL2 is enhanced as compared with the passivation layer PL1 (see JP-A-SHO62-128128 and JP-A-SHO62-242331).

In the semiconductor device of FIG. 2, however, as stated above, since the PSG layer 3 has deteriorated step coverage characteristics, it is impossible to thicken the silicon nitride layer 5, so that the prevention of penetration of water into the metal connections 2 is insufficient. Also, two different kinds of insulating layers used in the passivation layer require two different manufacturing apparatuses i.e., an APCVD apparatus and a plasma CVD apparatus In this case, three apparatuses are substantially required. Thus, the manufacturing cost is increased.

Figure 3:
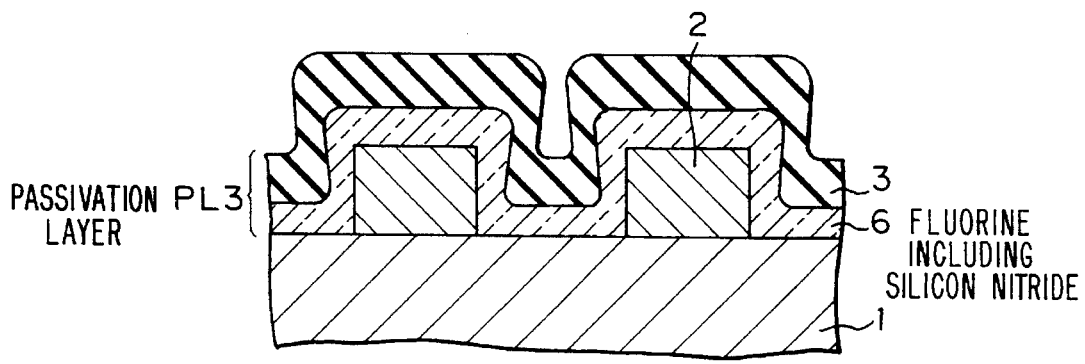
FIG. 3 is a cross-sectional view illustrating a third prior semiconductor device.

In FIG. 3, which illustrates a third prior art semiconductor device, a fluorine-including silicon nitride layer 6 is provided instead of the PSG layer 3 of FIG. 1, to obtain a passivation layer PL3 as a double layer configuration. In this case, the thickness of the fluorine-including silicon nitride layer 6 is 500 nm, and the thickness of the silicon nitride layer 3 is also 500 nm. The fluorine-including silicon nitride layer 6 is deposited by a plasma CVD apparatus using reaction gas of $Si_2F_6$, $N_2$ and $H_2$ (see JP-A-SHO62-174927). As a result, deterioration of semiconductor elements formed beneath the passivation layer PL3 due to the diffusion of hydrogen can be avoided, and simultaneously, erosion of the metal connections 2 beneath the passivation layer PL3 can be avoided by using the water resistance characteristics of silicon nitride.

In the semiconductor device of FIG. 3, however, as stated above, since the fluorine-including silicon nitride layer 6 reacts with water ($H_2O$) to generate hydrogen fluoride (HF), the metal connections 2 beneath the passivation layer PL3 are eroded by the hydrogen fluoride.

Figure 4:
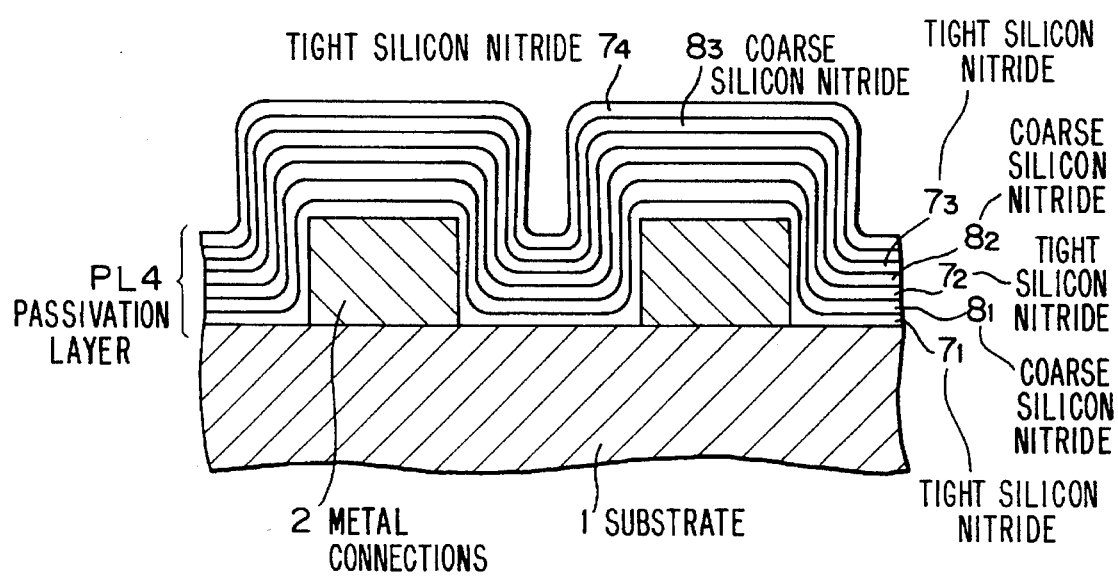
FIG. 4 is a cross-sectional view illustrating an embodiment of the semiconductor device according to the present invention.

In FIG. 4, which illustrates an embodiment of the present invention, a passivation layer PL4 includes a laminated configuration formed by a plurality of tight silicon nitride layers such as $7_1$, $7_2$, $7_3$ and $7_4$ and a plurality of coarse silicon nitride layers $8_1$, $8_2$ and $8_3$ alternating with the tight silicon nitride layers $7_1$, $7_2$, $7_3$ and $7_4$. Here, the tight silicon nitride layers $7_1$, $7_2$, $7_3$ and $7_4$ include a larger number of Si—N molecules per unit volume, while the coarse silicon nitride layers $8_1$, $8_2$ and $8_3$ include a smaller number of Si—N molecules per unit volume. In this case, the silicon nitride layers $7_1$, $7_2$, $7_3$ and $7_4$, $8_1$, $8_2$ and $8_3$ include hydrogen other than Si—N molecules which are heavier than hydrogen. Therefore, the density of the tight silicon nitride layers $7_1$, $7_2$, $7_3$ and $7_4$ is larger than that of the coarse silicon nitride layers $8_1$, $8_2$ and $8_3$. For example, the density of the tight silicon nitride layers $7_1$, $7_2$, $7_3$ and $7_4$ is about 2.60 g/cm$^3$, and the density of the coarse silicon nitride layers $8_1$, $8_2$ and $8_3$ is about 2.55 g/cm$^3$.

Also, for example, each silicon nitride layer is about 0.15 μm thick and therefore, the silicon nitride layers $7_1$, $7_2$, $7_3$, $7_4$, $8_1$, $8_2$ and $8_3$ in total are about 1.05 μm thick.

The tight silicon nitride layers $7_1$, $7_2$, $7_3$ and $7_4$ have high water resistance characteristics, while the coarse silicon nitride layers $8_1$, $8_2$ and $8_3$ have high water absorption characteristics. Therefore, if defects are generated in one of the silicon nitride layers $7_1$, $7_2$, $7_3$ and $7_4$, these defects are compensated for by the next lower one such as $7_1$, $7_2$ or $7_3$.

Since each of the layers $7_1$, $7_2$, $7_3$, $7_4$, $8_1$, $8_2$ and $8_3$ of the passivation layer PL4 is made of silicon nitride, the entire passivation layer PL4 can be manufactured by using the same CVD apparatus, thus reducing the manufacturing cost.

Figure 5A:
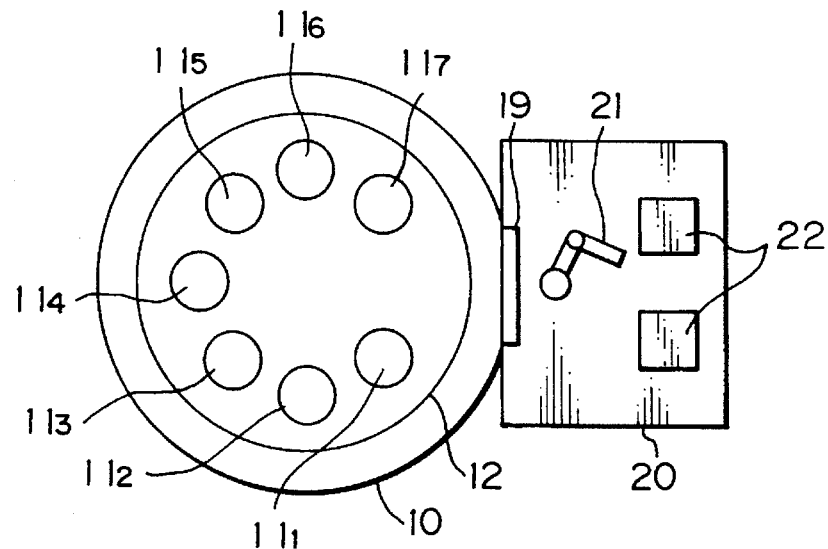
FIG. 5A is a plan view illustrating a plasma chemical vapor deposition (CVD) apparatus for manufacturing the semiconductor device of FIG. 4.
Figure 5B:
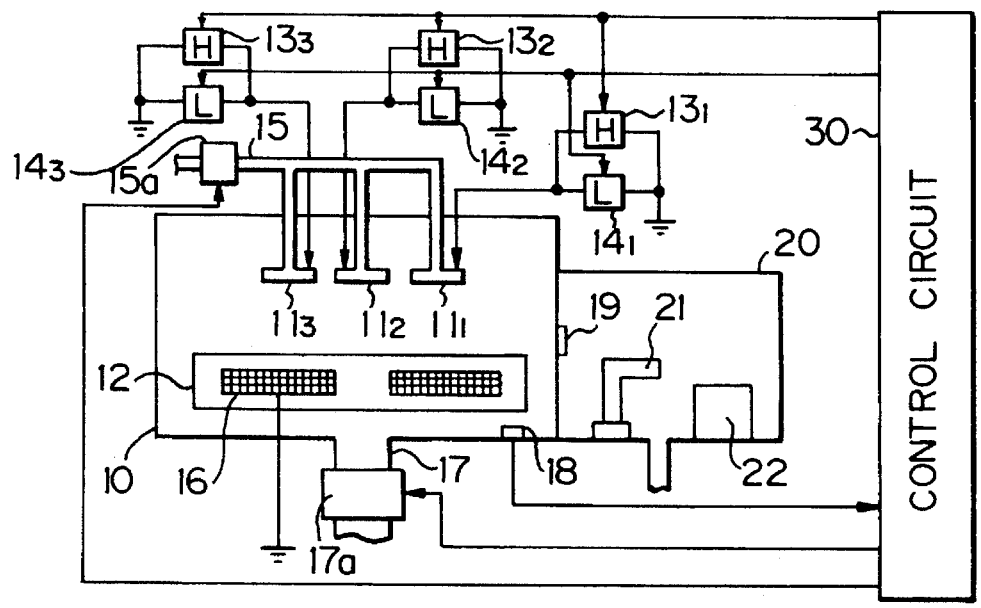
FIG. 5B is a side view of the apparatus of FIG. 5A.

FIG. 5A is a plan view illustrating a plasma CVD apparatus for forming the passivation layer PL4 of FIG. 4, and FIG. 5B is a side view of the apparatus of FIG. 5A. Referring to FIGS. 5A and 5B, this CVD apparatus is comprised of a reaction chamber 10 and a load/lock chamber 20.

Provided in the reaction chamber 10 are upper electrodes $11_1$, $11_2$, . . . , $11_7$ and a lower electrode 12.

Each of the upper electrodes $11_1$, $11_2$, . . . , $11_7$ is connected to a high frequency power supply such as $13_1$ having a frequency of 13.56 MHz and a low frequency power supply such as $14_1$ having a frequency of 350 kHz. Also, the upper electrodes $11_1$, $11_2$, . . . , $11_7$ are connected to a gas inlet 15 whose gas stream is controlled by a gas stream control unit 15a.

The lower electrode 12 incorporates a heater 16 therein.

Also, provided in the reaction chamber 10 are a gas outlet 17 whose gas stream is controlled by a gas stream control unit 17a and a pressure sensor 18.

Further, provided between the reaction chamber 10 and the load/lock chamber 20 is a gate valve 19.

Provided in the load/lock chamber 20 are a robot 21 and a wafer cassette 22 into which wafers are placed.

The high frequency power supplies $13_1$, $13_2$, . . . , $13_7$, the low frequency power supplies $14_1$, $14_2$, . . . , $14_7$, the gas stream control units 15a and 17a, and the pressure sensor 18 are connected to a control circuit 30 which is constructed by a microcomputer or the like.

The CVD apparatus of FIGS. 5A and 5B is operated as follows. First, a vacuum is drawn from the reaction chamber 10 and the load/lock chamber 20. Next, wafers are transferred by the robot 21 from the wafer cassette 22 via the gate valve 19 to the lower electrode 12. Then, the gate valve 19 is closed.

In the above-mentioned state, the control circuit 30 makes the power of each of the high frequency power supplies $13_1$, $13_2$, . . . , $13_7$ 200 W and makes the power of each of the low frequency power supplies $14_1$, $14_2$, . . . , $14_7$ 200 W. Also, in this case, a reaction gas of $SiH_4$ (300 sccm), $NH_3$ (500 sccm) and $N_2$ (500 sccm) is supplied to the reaction chamber 10 at a substrate temperature of 300° C. and at a pressure of 3 Torr. Thus, the tight silicon nitride layer $7_1$ having a thickness of about 150 nm is grown.

Next, the control circuit 30 changes the power each of the high frequency power supplies $13_1$, $13_2$, . . . , $13_7$ from 200 W to 300 W and changes the power of each of the low frequency power supplies $14_1$, $14_2$, . . . , $14_7$ from 200 W to 100 W. As a result, the coarse silicon nitride layer $8_1$ having a thickness of about 150 nm is grown.

Hereinafter, only the power of the power supplies $13_1$, $13_2$, . . . , $13_7$ and $14_1$, $14_2$, . . . , $14_7$ are changed to thereby grow the silicon nitride layers $7_2$, $8_2$, $7_3$, $8_3$ and $7_4$, sequentially.

Finally, the wafers on which the passivation layer PL4 is formed are transferred by the robot 21 from the reaction chamber 10 to the load/lock chamber 20.

Figure 6:
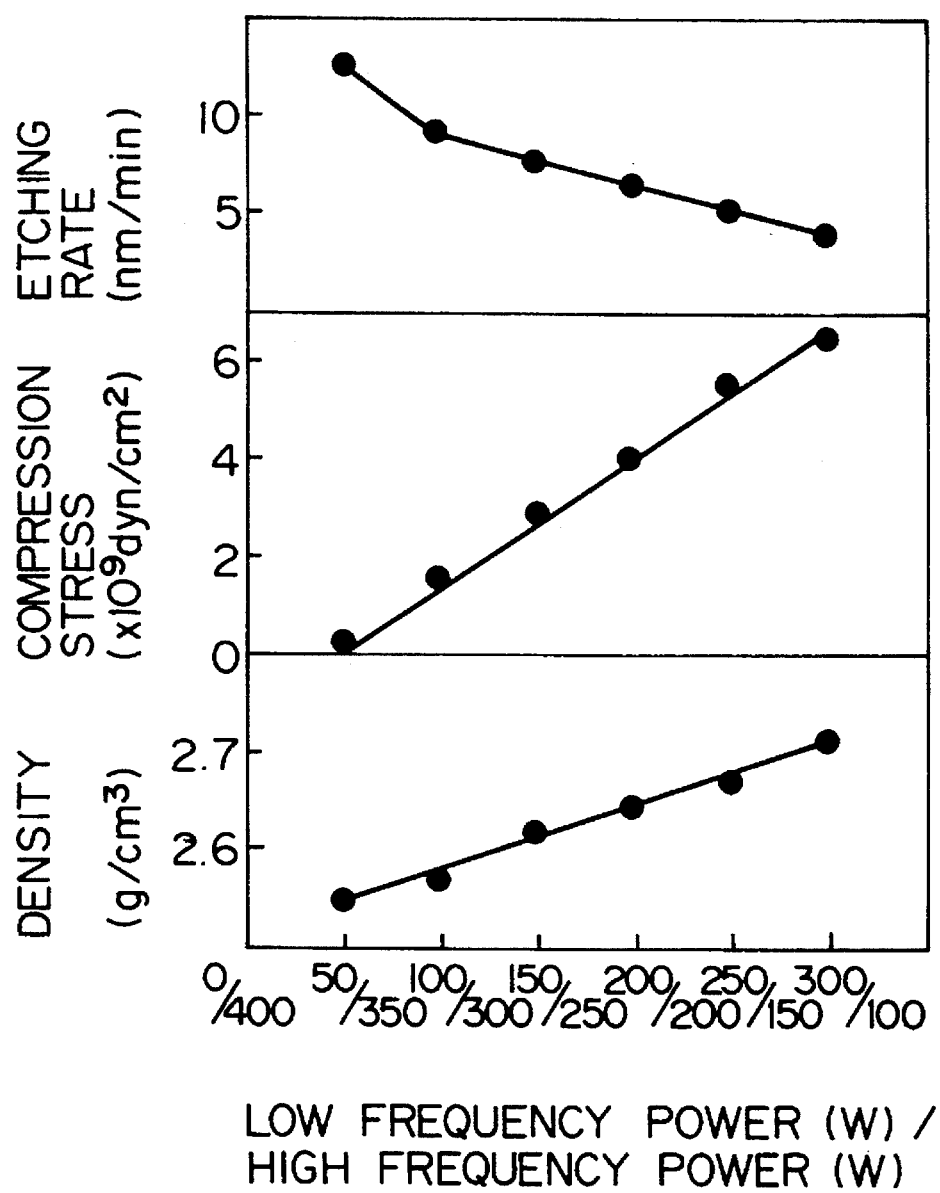
FIG 6 is a graph showing the characteristics of silicon nitride dependent on the RF power in the apparatus of FIG. 5.

Actually, as shown in FIG. 6, the density of silicon nitride is dependent upon the ratio of the power of the low frequency power to that of the high frequency. That is, when this ratio is increased, the bombardment with ions is increased to enlarge the density of silicon nitride. For example, when the power of each of the high frequency power supplies $13_1$, $13_2$, . . . , $13_7$ is 200 W and the power of each of the low frequency power supplies $14_1$, $14_2$, . . . , $14_7$ is 200 W, the density of silicon nitride is about 2.60 g/cm$^3$, while when each power of the high frequency power supplies $13_1, 13_2, \ldots, 13_7$ is 300 W and the power of each of the low frequency power supplies $14_1, 14_2, \ldots, 14_7$ is 100 W, the density of silicon nitride is about 2.55 g/cm$^3$. In this case, when the density of silicon nitride is increased, the compression stress within the silicon nitride is increased, but the etching rate is decreased.

In the CVD apparatus of FIGS. 5A and 5B, although the growth of the tight silicon nitride layers and the growth of the coarse silicon nitride layers are switched by changing the power of the power supplies, it is possible to switch the growth of the layers by changing the amount of gas or the pressure within the reaction chamber 10. For example, the change of the amount of gas is carried out by controlling the gas stream control unit 15a. Also, the pressure within the reaction chamber 10 is controlled by monitoring it with the pressure sensor 18 to control the gas stream control unit 17a.

As explained hereinbefore, according to the present invention, since a passivation layer is constructed by laminated tight insulating layers and coarse insulating layers alternating with the tight insulating layers, the peneration of water absorbed in one of the coarse insulating layers into another can be prevented by the tight insulating layers. Also, the tight insulating layers and the coarse insulating layers are made of the same material, so that the manufacturing cost therefor can be reduced, since the same apparatus can be used for manufacturing the passivation layer.

I claim:

1. A semiconductor device comprising:

a semiconductor substrate;

an element formed above said semiconductor substrate; and a passivation layer formed on said element, said passivation layer including a laminated configuration formed by a plurality of tight insulating layers and a plurality of coarse insulating layers alternating with said tight insulating layers, said insulating layers being made of silicon nitride.

2. A device as set forth in claim 1, wherein a density of said tight insulating layers is about 2.60 g/cm$^3$, and a density of said coarse insulating layers being about 2.55 g/cm$^3$.

3. A device as set forth in claim 1, wherein said tight insulating layers and said coarse insulating layers are manufactured by using the same CVD apparatus.

4. A semiconductor device comprising:

a semiconductor substrate;

an element formed above said semiconductor substrate; and a passivation layer formed on said element, said passivation layer including a laminated configuration formed by a plurality of first insulating layers and a plurality of second insulating layers alternating with said first insulating layers, said first and second insulating layers being made of the silicon nitrite, a density of said first insulating layers being larger than density of said second insulating layers.

5. A device as set forth in claim 4, wherein a density of said first insulating layers is about 2.60 g/cm$^3$, and a density of said second insulating layers being about 2.55 g/cm$^3$.

6. A device as set forth in claim 4, wherein said first insulating layers and said second insulating layers are manufactured by using the same CVD apparatus.

* * * * *